US008652936B2

(12) United States Patent
Sirbu et al.

(10) Patent No.: US 8,652,936 B2
(45) Date of Patent: Feb. 18, 2014

(54) VERTICAL CAVITY SURFACE EMITTING DEVICES INCORPORATING WAFER FUSED REFLECTORS

(75) Inventors: Alexei Sirbu, Ecublens (CH);
Alexandru Mereuta, Ecublens (CH);
Andrei Caliman, Chavannes-Renens (CH)

(73) Assignee: Ecole Polytechnique Federale de Lausanne, Lausanne (CH)

( * ) Notice: Subject to any disclaimer, the term of this patent is extended or adjusted under 35 U.S.C. 154(b) by 0 days.

(21) Appl. No.: 13/380,328

(22) PCT Filed: Jul. 1, 2010

(86) PCT No.: PCT/EP2010/003980
§ 371 (c)(1),
(2), (4) Date: Feb. 9, 2012

(87) PCT Pub. No.: WO2011/000568
PCT Pub. Date: Jan. 6, 2011

(65) Prior Publication Data
US 2012/0134381 A1 May 31, 2012

Related U.S. Application Data

(60) Provisional application No. 61/222,768, filed on Jul. 2, 2009.

(51) Int. Cl.
H01L 21/00 (2006.01)
H01L 21/30 (2006.01)
H01L 21/46 (2006.01)
H01S 5/00 (2006.01)

(52) U.S. Cl.
USPC .............................. 438/458; 438/32; 438/455

(58) Field of Classification Search
None
See application file for complete search history.

(56) References Cited

U.S. PATENT DOCUMENTS

| 6,277,696 B1 * | 8/2001 | Carey et al. .................... 438/289 |
| 6,493,373 B1 | 12/2002 | Boucart et al. |
| 2004/0264541 A1 * | 12/2004 | Wang et al. ..................... 372/99 |

FOREIGN PATENT DOCUMENTS

| GB | 2346479 A | 8/2000 |
| GB | 2347559 A | 9/2000 |

OTHER PUBLICATIONS

VCSELs emitting in the 1310 nm waveband for novel optical communication applications, by Syrbu et al Vertical-Cavity Surface-Emitting Lasers IX, edited by Chun Lei, Kent D. Choquette, Proceedings of SPIE vol. 5737 (SPIE, Bellingham, WA, 2005) doi: 10.1117/12.606964.*

(Continued)

Primary Examiner — Jessica Stultz
Assistant Examiner — Sean Hagan
(74) Attorney, Agent, or Firm — Saliwanchik, Lloyd & Eisenschenk

(57) ABSTRACT

A method of forming an optoelectronic device comprising growing a first multi-layer 2 representing a reflector on a first substrate and a second multilayer 4 representing an active region on a second substrate, the first and second substrates being lattice mismatched, fusing the first multi-layer 2 to a third substrate 3, wherein the material of the third substrate 3 is lattice matched with respect to the material of the second multi-layer 4, removing the first substrate to expose the first multi-layer 2, and fusing the first multi-layer to the second multi-layer 4.

13 Claims, 5 Drawing Sheets

(56) References Cited

OTHER PUBLICATIONS

Design and optimization of high-performance 1.3 micron VCSELs, by Piprek et al. Physics and Simulation of Optoelectronic Devices XII, edited by Marek Osinski, Hiroshi Amano, Fritz Henneberger, Proceedings of SPIE vol. 5349 (SPIE, Bellingham, WA, 2004) doi: 10.1117/12.543062.*

High Single Mode Power Wafer Fused InAlGaAs/InP—AlGaAs/GaAs VCSELs Emitting in the 1.3-1.6μm Wavelength Range, by Mereuta et al. 2007 International Conference on Indium Phosphide and Related Materials Conference Proceedings 19th IPRM May 14-18, 2007 Matsue, Japan.*

NPL literature Crystal Defects, dated Nov. 30, 2004, http://www.ndt-ed.org/EducationResources/CommunityCollege/Materials/Structure/crystal_defects.htm.*

Cheng, K.Y., et al., "Fabrication of Substrate-Independent Hybrid Distributed Bragg Reflectors Using Metallic Wafer Bonding," *IEEE Photonics Technology Letters*, Mar. 2004, vol. 16, No. 3, pp. 837-839.

Okuno, Y.L., et al., "1.3 μm Wavelength Vertical Cavity Surface Emitting Laser Fabricated by Orientation-Mismatched Wafer Bonding: A Prospect for Polarization Control," *Applied Physics Letters*, Apr. 14, 2003, vol. 82, No. 15, pp. 2377-2379.

Tawara, T., et al., "Observation of InGaN Cavity Polaritons at Room Temperature," International Quantum Electronics Conference, May 21, 2004, San Francisco, CA, pp. 634-635.

* cited by examiner

InAlGaAs/InP active is shrinked

VERTICAL CAVITY SURFACE EMITTING DEVICES INCORPORATING WAFER FUSED REFLECTORS

CROSS-REFERENCE TO RELATED APPLICATIONS

This application is the U.S. national stage application of International Patent Application No. PCT/EP2010/003980, filed Jul. 1, 2010, which claims the benefit of U.S. Provisional Patent Application Ser. No. 61/222,768, filed Jul. 2, 2009, the disclosures of which are incorporated by reference herein in their entirety, including any figures, tables, or drawings.

The present invention refers to a method of manufacturing an optoelectronic device and in particular a method of manufacturing a vertical cavity surface emitting device incorporating wafer fused reflectors.

BACKGROUND OF THE INVENTION

Vertical cavity surface emitting devices like Vertical cavity surface emitting lasers (VCSELs), vertical external cavity surface emitting lasers (VECSELs), vertical cavity semiconductor optical amplifiers (VCSOAs), etc. present an important class of photonic devices. Normally, these devices incorporate an active region and one, or two distributed Bragg reflectors (DBRs). Depending on the emission wavelength, there are situations when the best performance of the active region and of the DBRs may be achieved using different semiconductor materials. One example are vertical cavity devices emitting in the 1200 nm-2300 nm band that make use of InP based active regions. Currently, InAlGaAs multi-quantum wells (MQWs) grown on InP substrates demonstrate best results. Besides high gain active cavity material in the full temperature operation range, distributed Bragg reflectors (DBRs) with very good optical and thermal properties are important for reaching high VCSEL performance. Unfortunately, distributed Bragg reflectors (DBRs) based on InAlGaAs/InP have inferior optical and thermal properties compared with AlGaAs/GaAs-based DBRs that can be grown lattice matched to GaAs substrates. (See Table 1).

TABLE 1

Optical and thermal properties of different DBR material systems

| DBR Materials | Index Contrast $\Delta n = (n_H - n_L)$ | No of pairs for 99.9% reflectivity | Stopband Width, nm | Total thickness, μm | Thermal conductivity, W/cm K |
|---|---|---|---|---|---|
| InAlGaAs/InP | 0.187 | 63 | 54 | 12.3 | 0.045 |
| AlGaAsSb/ AlAsSb | 0.49 | 27 | 127 | 5.2 | 0.059 |
| AlGaAs/GaAs | 0.5 | 23 | 158 | 4.8 | 0.650 |
| SiO$_2$/TiO$_2$ | 0.77 | 9 | 436 | 3.3 | 0.015 |

AlGaAsSb DBRs lattice matched to InP have an index contrast between high-index ($n_H$) and low index ($n_L$) quarter-wavelength layers comparable to that of AlGaAs/GaAs-based DBRs but with one order of magnitude lower thermal conductivity. Dielectric DBRs, like SiO$_2$/TiO$_2$ have very good optical properties, but thermal conductivity is quite low. One solution to this problem is to use wafer fusion for bonding AlGaAs/GaAs DBRs on both sides of the InP/InAlGaAs based active cavity.

The U.S. Pat. No. 6,277,696 B1 describes the steps of surface emitting laser fabrication using two wafer bonded mirrors in the following way:

1) growing two AlGaAs/GaAs DBR mirrors on GaAs substrates and one InAlGaAs/InP active cavity on a InP substrate;
2) fusing one DBR mirror to the active cavity followed by InP substrate selective etch and fusing the second DBR mirror to the active cavity followed by GaAs substrate selective etch.

These elements have been applied in the fabrication of different types of vertical cavity photonics devices as described in the following publications:

Single fused VCSELs based on one AlGaAs/GaAs DBR fused to InP-based active and DBR: S. Rapp, F. Solomonson, K. Streubel, S. Mogg, F. Wennekes, J. Bentell, M. Hammar "All-Epitaxial Single-Fused 1.55 um Vertical Cavity Laser based on an InP Bragg Reflector" Jpn. J. Appl. Phys., Vol. 38, pp. 1261-1264, 1999;

Double fused fixed wavelength VCSELs: V. Jayaraman et al., "High power 1320-nm wafer-bonded VCSELs with tunnel junctions", IEEE Photonics Technology Letters, vol. 15, pp. 1495-1497, 2003;

Tunable VCSELs: A. Syrbu et all, "1.55 um optically pumped wafer-fused tunable VCSELs with 32-nm tuning range", IEEE Photon. Technol. Lett., vol. 16, pp. 1991-1993, 2004;

Fixed wavelength optical amplifiers: E. S. Bjorlin, B. Riou, P. Abraham, J. Piprek, Y.-J. Chiu, K. A. Black, A. Keating, J. E. Bowers, "Long-wavelength vertical-cavity semiconductor optical amplifiers", IEEE J. Quantum Electron., vol. 37, pp. 274-281, 2001";

Tunable optical amplifiers: G. D. Cole, E. S. Bjorlin, C. S. Wang, N. C. MacDonald, J. E. Bowers, "Widely tunable bottom-emitting vertical cavity SOAs," IEEE Photonics Technology Letters, 17, pp. 390-407, 2005.

This conventional method has produced a very good long-wavelength VCSEL performance. One example can be found in A. Mircea et al "Cavity Mode—Gain Peak Tradeoff for 1320-nm Wafer-Fused VCSELs With 3-mW Single-Mode Emission Power and 10-Gb/s Modulation Speed Up to 70° C.", Phot. Techn. Lett. V. 19, issue 2, 2007, pp. 121-123.

Although VCSELs obtained by this method offer improved VCSEL performance compared to VCSELs with non-fused mirrors described in Table 1, the approach according to the U.S. Pat. No. 6,277,696 B1 has one important drawback that results from fusing of active cavity and the first DBR that are placed on different substrates, correspondingly on InP and GaAs, that have quite different values of lattice parameters and thermal expansion coefficients (See Table 2).

TABLE 2

Lattice parameters and thermal expansion coefficients of GaAs and InP

| Substrate material | Lattice parameter, Å | Thermal expansion Å/K, 10$^6$ |
|---|---|---|
| GaAs | 5.6535 | 5.8 |
| InP | 5.86875 | 4.8 |

In order to obtain an acceptable bonding strength, the wafer fusion is normally performed at 600° C. At this temperature very strong covalent bonds are formed between GaAs-based and InP-based wafers. During cooling down a considerable amount of strain is built-in the fused wafers stack as a result of different thermal expansion coefficients of initial wafers. At room temperature this ends-up in a substantial bending (elastic deformation) of the fused wafers stack with a radius of curvature of about 0.6 m (when the thickness of GaAs- and InP-based wafers is about 350 μm) (See FIG. 1).

After selective etching of the InP substrate 3 the fused wafer consisting of an InAlGaAs/InP active cavity 4 and an AlGaAs/GaAs reflector 2 on a GaAs substrate 1 is becoming planar again (See FIG. 2) because the GaAs-substrate with AlGaAs/GaAs on top, which is about 100 times thicker than the thickness of the active multi-layers returns to its initial planar state. As the result of this, the InP-based active cavity undergoes a lateral compressive strain to a point so that it laterally shrinks. The value of the shrinking, which represents a lateral material displacement in the active region is in the range of 3-7 μm per centimeter. This shrinking effect induces a problem for further processing steps that need a precise alignment with the electrical/optical aperture position defined in the active region before the fusion. Another important drawback consists in the formation of defects in the active region as a result of this high compressive strain. These defects represent a risk for device degradation during long-term operation.

It is the object of the present invention to provide an improved method of forming an optoelectronic device by high-temperature wafer fusion of wafers with different thermal expansion coefficients, wherein the build-up of strain and a lateral material displacement and a formation of defects in the active region related to it is reduced, and a corresponding semiconductor device.

SUMMARY OF INVENTION

According to embodiments of the present invention a method of forming an optoelectronic device is provided comprising growing a first multi-layer representing a reflector on a first substrate; and growing a second multi-layer representing an active region on a second substrate, the first and second substrates being lattice mismatched; fusing the first multi-layer to a third substrate, wherein the material of the third substrate is lattice matched with respect to the material of the second multilayer; removing the first substrate to expose the first multi-layer; and fusing the first multi-layer to the second multi-layer.

Preferably, the substrates on which the first and second multi-layers are grown have different thermal expansion coefficients and lattice parameter values at room temperature.

The present invention permits an improved manufacture of an optoelectronic device avoiding building-up of a mechanical stress and related linear material displacement, and defect formation in the active material multilayer due to the fact that a first material multi-layer comprising a reflector such as a DBR that is initially grown on a substrate preferably without any lattice mismatch is then fused to a third substrate that it is lattice matched with the material of a second multilayer comprising an active structure. The fusing may be performed thermally in a chamber at 600° C. The resulting fused stack is bent because of the difference in thermal expansion coefficients and room temperature lattice mismatch of the first and third substrates. Removing the first substrate, for example, by etching results in a planar fused wafer. During this return of the third substrate to its initial planar state, the first material multi-layer that is subsequently fused to the third substrate accumulates a mechanical strain that may result in some lateral material displacement. However, in the case of a multi-layer reflector this does not affect neither the further processing, nor the final device reliability. A subsequent fusion preferably carried out with the conditions as for the first fusion of a second material layer that is grown on a second substrate and comprises an optically active multi-layer does not result in a bending of the fused stack because the second and third substrates do not have a lattice mismatch. Hence, there is practically no build-up of mechanical stress during cooling-down and, consequently, no lateral material displacement and defect formation related to it.

According to one embodiment the method further comprises removing the second substrate on which the second material multi-layer is grown after fusing the second material multi-layer to the first material multi-layer.

According to another embodiment the first substrate is formed of GaAs and the first material multi-layer and the reflector are formed of multi-layers of AlGaAs and GaAs. Hence, there is not lattice mismatch between the first substrate and the first material multi-layer.

According to a further embodiment the second substrate is formed of InP. Similarly, the third substrate can be made of InP and can have the same lattice constant as the second substrate.

According to yet another embodiment, the optically active multi-layer comprises several quantum wells formed of layers of InAlGaAs and InP.

According to one embodiment the method further comprises the steps of growing a third material representing a reflector on a fourth substrate; fusing the third multi-layer to a fifth substrate, wherein the material of the fifth substrate has no lattice mismatch with respect to the material of the second multilayer comprising the active region; removing the fourth substrate to expose the third multi-layer; fusing the third multi-layer to the exposed surface of the second multi-layer; and removing the fifth substrate by selective chemical etching. The third material may be made of the same multi-layers as the first material multilayer, the fourth substrate may be made of the same material as the first substrate, and the fifth substrate may be made of the same material as the third substrate. Providing the above additional steps an optical device such as a VCSEL having two reflector stacks can be manufactured according to the principles of the present invention.

According to the invention a semiconductor device and in particular an optoelectronic device is provided comprising a first multi-layer representing a reflector fused to a substrate, and a second multilayer representing an active region being fused to the first multi-layer, wherein the material of the substrate is entirely or at least closely lattice matched with respect to the material of the second multi-layer. The device has an improved optical performance compared to devices of prior art, since a formation of defects in its active region during its manufacture can be avoided. Furthermore, a device degradation during long-term operation due to internal strains in the active region is significantly reduced.

According to one embodiment the second multilayer representing the active region comprises substantially no material displacement and defect formation due to mechanical stress. This can be achieved by the lattice match between the second multi-layer and the substrate on which the second multi-layer is grown. After the growth process and during cooling-down of the sample, there is practically no build-up of mechanical stress and, consequently, no lateral material displacement and defect formation related to it. A subsequent fusion of the second multilayer to the first multilayer neither leads to a build-up of mechanical stress although the first multi-layer may not be lattice matched with the material of the second multi-layer.

According to another embodiment the first multi-layer may comprise a lateral material displacement. However, since the first multi-layer is a multi-layer reflector this neither affects the further processing, nor the final device reliability. The lateral material displacement may arise, since the first material multi-layer comprising the reflector such as a DBR is grown initially on a substrate preferably without any lattice mismatch and is then fused to a substrate that it is lattice matched with the material of the second multilayer comprising the active structure but is not lattice matched with the first material multi-layer. After the fusing the resulting stack is bent.

After removing the substrate on which the first material multi-layer is initially grown on the substrate to which the first multilayer is fused returns its initial planar state and consequently the first material multi-layer may accumulate a mechanical strain that may result in some lateral material displacement.

According to another embodiment the substrate is formed of InP and the first multi-layer representing the reflector is formed of multi-layers of AlGaAs and GaAs.

According to a further embodiment the active region is optically active and comprises one or several quantum wells formed of layers of InAlGaAs and InP.

According to yet another embodiment the semiconductor device further comprises a third multi-layer fused to the surface of the second multi-layer, wherein the third multi-layer represents a reflector formed of the same material as the first multi-layer.

According to still another embodiment the first multi-layer and the third multi-layer each comprises a lateral material displacement due to mechanical strain due to a lattice mismatch between the second multilayer and the first multi-layer and a lattice mismatch between the second multilayer and the third multi-layer.

According to still another embodiment the semiconductor device comprises electrical contacts connecting the second multilayer to a voltage source. The electrical contacts preferably contact the top and the bottom side of the second multi-layer representing the optically active region. The electrical contacts may be fabricated by using semiconductor manufacturing techniques such as sputtering or evaporation.

In the following an exemplifying embodiment of the invention is described with reference to the accompanying drawing in which FIG. 1 shows the bending of a fused stack after cooling-down to room temperature according to the prior art;

Referring to FIGS. 3 to 9 an embodiment of the present invention is described. A vertical cavity emitting device with an InP-based high gain active region 4 and at least one AlGaAs/GaAs-based distributed Bragg Reflector 2, 6 that is wafer-fused to the active region 4 is provided. The Bragg Reflector may be formed in correspondence with the parameters indicated in Table 1.

Figure 1:
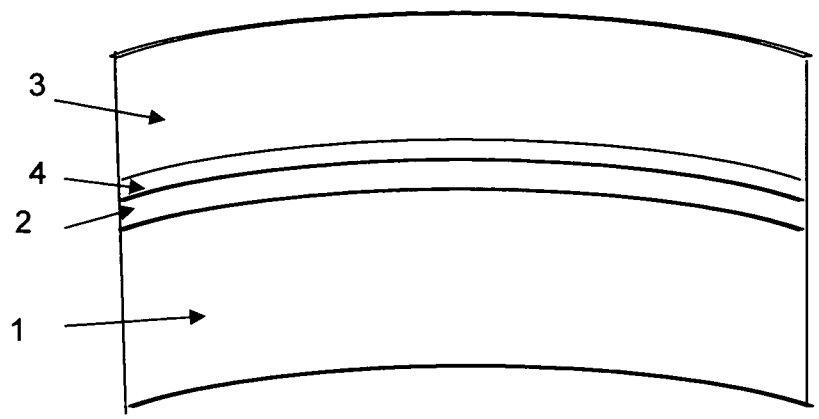
Figure 2:
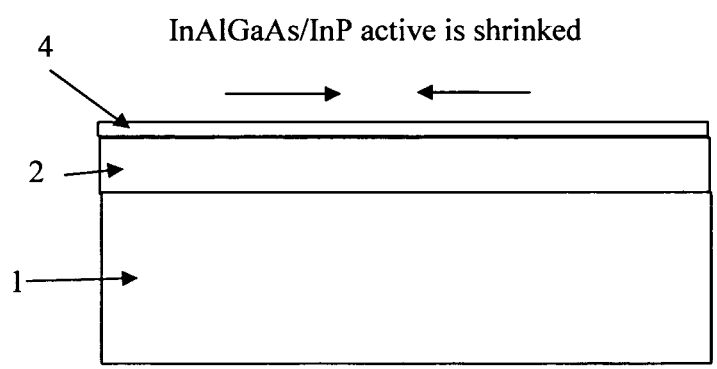
FIG. 2 shows how a fused stack becomes planar after a InP-substrate etch according to the prior art resulting in a shrinking of the InAlGaAs/InP active layer.
Figure 3:
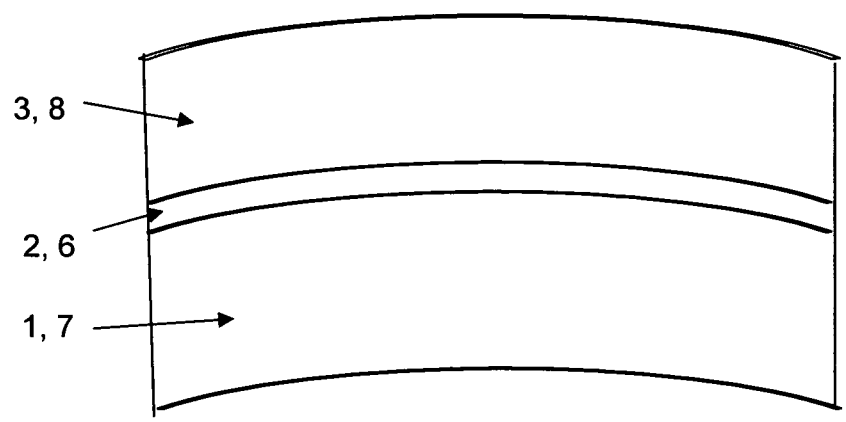
FIG. 3 shows a AlGaAs/GaAs DBR grown on a GaAs substrate and fused to a InP substrate, wherein the fused stack is bent according to one embodiment of the invention.
Figure 4:
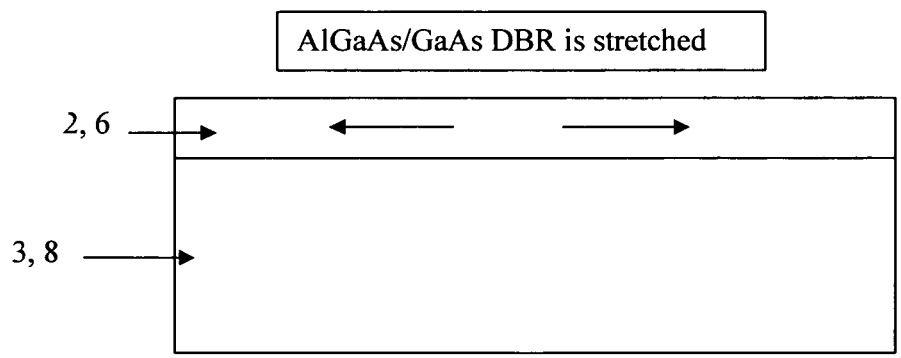
FIG. 4 shows that the fused stack becomes planar after the GaAs-substrate selective etching, wherein the AlGaAs/GaAs DBR is stretched according to one embodiment of the invention.
Figure 5:
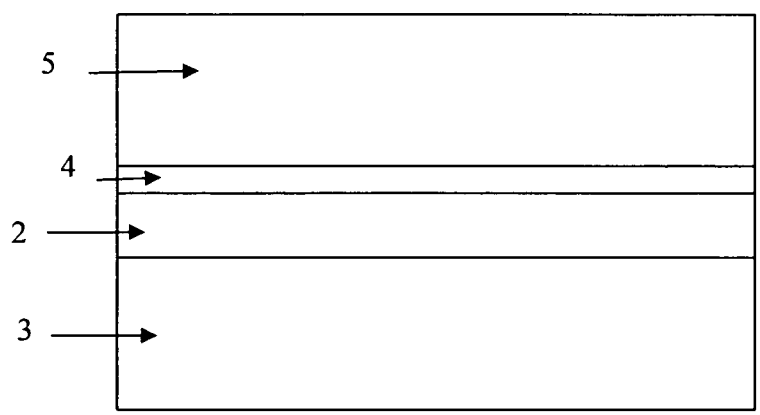
FIG. 5 shows that no bending is observed after cooling-down of the fused AlGaAs/GaAs/InP—InAlGaAs/InP stack according to one embodiment of the invention.
Figure 6:
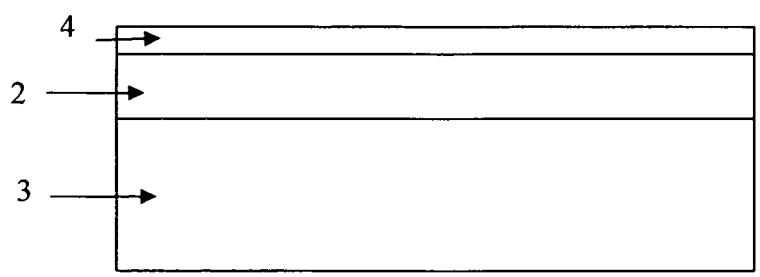
FIG. 6 shows a sample according to one embodiment of the invention wherein the InP substrate of the InAlGaAs/InP active layer has been etched so that a single fused "half-cavity" is formed.
Figure 7:
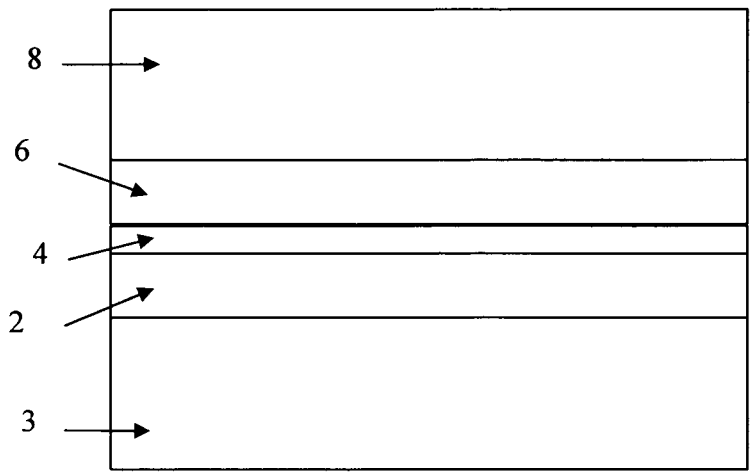
FIG. 7 shows the sample according to the embodiment of the invention wherein a second DBR transferred to an InP-substrate is fused to the single fused half-cavity.
Figure 8:
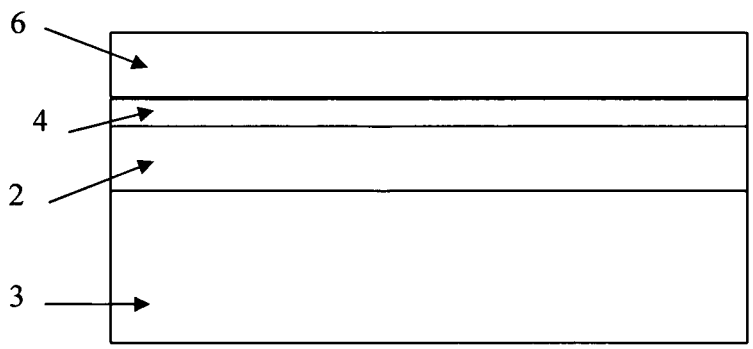
FIG. 8 shows the sample after the InP-substrate of the second AlGaAs/GaAs DBR has been etched resulting in a double fused wafer containing a InAlGaAs/InP-based active cavity material sandwiched between two AlGaAs/GaAs DBRs on a InP substrate.

Unlike prior InP-based and GaAs-based fused vertical cavity devices, the AlGaAs/GaAs-based DRB 2,6, that is initially grown on a GaAs substrate 1, 7 is first fused to a InP substrate 3, 8. The wafer fusion may be performed at a temperature of 600° C. After this fusion the AlGaAs/GaAs—InP fused stack is bent as shown on FIG. 3. This fusion is followed by a GaAs substrate 1, 7 removal that results in a planar fused wafer containing the AlGaAs/GaAs DBR 2, 6 transferred to a InP substrate 3, 8 as shown in FIG. 4. The DBR is stretched due to the lattice mismatch between the material of the DBR and the InP substrate, and adapted to the InP substrate but there are no visible defects. When fusing the DBR 2 to a InAlGaAs/InP active cavity 4 grown on a InP substrate 5, there is no bending of the fused stack (see FIG. 5). After etching the InP-substrate 5 off the InAlGaAs/InP active material 4 there is no "shrinking" and no "dark lines" any more. Even without doing the second fusion, these half-cavities can be used for a number of vertical-cavity devices like tunable VCSELs and vertical external cavity surface-emitting lasers (VECSELs). In order to obtain a VCSEL, a second DBR 6 that is transferred to a InP substrate 8 is fused to the "half-cavity" as illustrated on FIG. 7. Etching of the InP-substrate 8 of the second AlGaAs/GaAs DBR 6 (see FIG. 8) results in a "classic" double-fused VCSEL wafer, but which is placed on a InP substrate 3 (not GaAs as usual) and which does not have "shrinking" and "dark-lines" in the active region. Finally, electric contacts to the active region 4 are formed.

Figure 9:
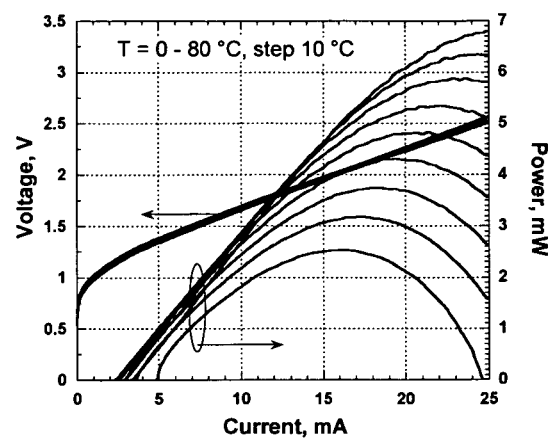
FIG. 9 shows LIV characteristics of a 1550 nm VCSEL fabricated according to the invention.

The method was applied to a VCSEL emitting in the 1550 nm and resulted in excellent performance of record high, single mode power values of 6.8 mW and 2.6 mW at 0° C. and 80° C. respectively (see FIG. 9).

Numerous modifications may be provided to the above embodiment without leaving the scope of the present invention. In particular different semiconductor materials comprising the same or similar characteristics, lattice matches and lattice mismatches between them can be used.

The invention claimed is:

1. A method of forming an optoelectronic device, comprising:
    growing a first multi-layer representing a first reflector on a first substrate and a second multi-layer representing an active region on a second substrate, the first and second substrates being lattice mismatched;
    fusing the first multi-layer to a third substrate, wherein the material of the third substrate is lattice matched with respect to the material of the second multi-layer;
    removing the first substrate to expose the first multi-layer; and
    fusing the first multi-layer to the second multi-layer.

2. The method according to claim 1, further comprising:
    removing the second substrate on which the second multi-layer is grown after fusing the second multi-layer to the first multi-layer.

3. The method according to claim 1, wherein the first substrate is formed of GaAs and the first multi-layer representing the first reflector is formed of multi-layers of AlGaAs and GaAs.

4. The method according to claim 3, wherein the third substrate is formed of InP.

5. The method according to claim 4, wherein the active region is optically active and comprises one or more quantum wells formed of layers of InAlGaAs and InP.

6. The method according to claim 2, further comprising:
growing a third multi-layer representing a second reflector on a fourth substrate;
fusing the third multi-layer to a fifth substrate, wherein the material of the fifth substrate is lattice matched with respect to the material of the second multi-layer;
removing the fourth substrate to expose the third multi-layer; and
fusing the third multi-layer to a surface of the second multi-layer.

7. The method according to claim 6, wherein the fourth substrate is equal to the first substrate and the fifth substrate is equal to the third substrate.

8. The method according to claim 6, further comprising:
removing the fifth substrate.

9. The method according to claim 2, wherein the first substrate is formed of GaAs and the first multi-layer representing the first reflector is formed of multi-layers of AlGaAs and GaAs.

10. The method according to claim 9, wherein the third substrate is formed of InP.

11. The method according to claim 10, wherein the active region is optically active and comprises one or more quantum wells formed of layers of InAlGaAs and InP.

12. The method according to claim 11, further comprising:
growing a third multi-layer representing a second reflector on a fourth substrate;
fusing the third multi-layer to a fifth substrate, wherein the material of the fifth substrate is lattice matched with respect to the material of the second multi-layer;
removing the fourth substrate to expose the third multi-layer; and
fusing the third multi-layer to a surface of the second multi-layer.

13. The method according to claim 12, wherein the fourth substrate is equal to the first substrate and the fifth substrate is equal to the third substrate.

* * * * *